(12) United States Patent
Kim et al.

(10) Patent No.: US 8,791,559 B2
(45) Date of Patent: Jul. 29, 2014

(54) SEMICONDUCTOR PACKAGE WITH PACKAGE ON PACKAGE STRUCTURE

(75) Inventors: Yong-hoon Kim, Suwon-si (KR); Hyo-soon Kang, Seoul (KR); Jin-kyung Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/604,301

(22) Filed: Sep. 5, 2012

(65) Prior Publication Data

US 2013/0168871 A1    Jul. 4, 2013

(30) Foreign Application Priority Data

Dec. 30, 2011 (KR) .......................... 10-2011-0147418

(51) Int. Cl.
*H01L 23/02* (2006.01)
*H01L 23/48* (2006.01)
*H01L 21/50* (2006.01)

(52) U.S. Cl.
USPC ...... 257/686; 257/690; 257/773; 257/E23.01; 257/E21.499

(58) Field of Classification Search
USPC ............. 257/686, 690, 773, E23.01, E21.499
See application file for complete search history.

(56) References Cited

U.S. PATENT DOCUMENTS

| 7,348,668 | B2 | 3/2008 | Masuda et al. | |
| 7,550,680 | B2 * | 6/2009 | Pendse | 174/520 |
| 7,847,413 | B2 * | 12/2010 | Akiba et al. | 257/777 |
| 8,399,306 | B2 * | 3/2013 | Koo et al. | 438/127 |
| 8,399,992 | B2 * | 3/2013 | Park et al. | 257/777 |
| 2006/0289981 | A1 * | 12/2006 | Nickerson et al. | 257/686 |
| 2009/0057918 | A1 * | 3/2009 | Kim | 257/777 |
| 2010/0065948 | A1 * | 3/2010 | Bae et al. | 257/621 |
| 2011/0049695 | A1 * | 3/2011 | Shin et al. | 257/686 |

FOREIGN PATENT DOCUMENTS

| JP | 2004221215 A | 8/2004 |
| JP | 2011081882 A | 4/2011 |
| KR | 20110006482 A | 1/2011 |

* cited by examiner

*Primary Examiner* — Luan C Thai
(74) *Attorney, Agent, or Firm* — Harness, Dickey & Pierce, P.L.C.

(57) ABSTRACT

A semiconductor package of a package on package structure reducing an overall thickness of the package and simplifying design complexity of wiring paths is provided. The package includes a first package including a first substrate and a first semiconductor chip portion mounted thereon, a second package disposed on the first package and including a second substrate and a second semiconductor chip portion mounted thereon, and a connection member connecting the first and second substrates. The second semiconductor chip portion includes at least one semiconductor chip including a group of chip pads corresponding to one channel, and the group of chip pads is concentrated on a first edge of the semiconductor chip. An intellectual property core corresponding to the one channel is formed on an edge of the first semiconductor chip portion and the IP core corresponds to the edge on which the group of chip pads is concentrated.

19 Claims, 7 Drawing Sheets

SEMICONDUCTOR PACKAGE WITH PACKAGE ON PACKAGE STRUCTURE

CROSS-REFERENCE TO RELATED APPLICATIONS

This application claims the benefit of Korean Patent Application No. 10-2011-0147418, filed on Dec. 30, 2011, in the Korean Intellectual Property Office, the disclosure of which is incorporated herein in its entirety by reference.

BACKGROUND

The inventive concepts relate to semiconductor apparatuses, and more particularly, to semiconductor packages that have a package on package (POP) structure.

Semiconductor products are required to process data of large capacity with gradually reduced sizes. Accordingly, semiconductor chips used in semiconductor products need to be highly integrated in single packages. In addition, with highly integrated semiconductor chips, demands for improved functions and reliability of the semiconductor chips, and high speed operation of an electronic system including integrated semiconductor chips are increasing.

SUMMARY

At least one embodiment of the inventive concepts provide semiconductor packages of a package on package (POP) structure, which may reduce an overall thickness of a package and simplify design complexity of wiring paths.

The inventive concepts also provide semiconductor packages of a POP structure, which may increase a memory capacity while ensuring a sufficient bandwidth.

According to an example embodiment, a semiconductor package of a package on package (POP) structure includes a first package having a first substrate and a first semiconductor chip portion mounted on the first substrate, a second package disposed on the first package, the second package having a second substrate and a second semiconductor chip portion mounted on the second substrate, and a connection member between substrates for connecting the first substrate and the second substrate to each other. The second semiconductor chip portion includes at least one semiconductor chip the at least one semiconductor chip includes a group of chip pads corresponding to one channel, and the group of chip pads is concentrated on a first edge of the semiconductor chip. An intellectual property (IP) core corresponding to the one channel is on an edge of the first semiconductor chip portion and the IP core corresponds to the first edge on which the group of chip pads is concentrated.

In the at least one semiconductor chip, a group of chip pads corresponding to another channel may be on a second edge of the semiconductor chip, the second edge facing the first edge. The one channel may be for 32 bits, and the group of chip pads may include pads for address terminals, pads for control terminals, and pads for data terminals in order to input/output 32-bit data.

The second semiconductor chip portion may include a first semiconductor chip including a first chip pad group corresponding to a first channel on a first edge of the first semiconductor chip and a second chip pad group corresponding to a second channel on a second edge of the first semiconductor chip.

The second semiconductor chip portion may include a first semiconductor chip and a second semiconductor chip. The first semiconductor chip may include a first chip pad group corresponding to a first channel on a first edge of the first semiconductor chip and a second chip pad group corresponding to a second channel on a second edge of the first semiconductor chip. The second semiconductor chip may include a third chip pad group corresponding to a third channel on a third edge of the second semiconductor chip, and a fourth chip pad group corresponding to a fourth channel on a fourth edge of the second semiconductor chip. The second semiconductor chip may be stacked on the first semiconductor chip such that the third and fourth chip pad groups are arranged to cross the first or second chip pad group at an angle of 90°.

First through fourth bonding pads groups may be disposed on four edges on the second substrate to correspond to locations of the first through fourth chip pad groups and the first through fourth chip pad groups may be respectively connected to corresponding first through fourth bonding pads groups through wire-bonding.

The second semiconductor chip portion may include a first semiconductor chip and a second semiconductor chip, where a first chip pad group corresponding to a first channel may be disposed on a first edge of the first and second semiconductor chips and a second chip pad group corresponding to a second channel may be disposed on a second edge of the first and second semiconductor chips. The first semiconductor chip may include through silicon vias (TSVs) and may be stacked on the second substrate in a flip-chip bonding, and the second semiconductor chip may be stacked on the first semiconductor chip in a flip-chip bonding, where the first and second chip pad groups of the second semiconductor chip may be configured to electrically connect the first and second chip pad groups of the first semiconductor chip through the TSVs.

According to an example embodiment, a semiconductor package includes a substrate. one or more semiconductor chips stacked on the substrate, and a sealing material for sealing the one or more semiconductor chips, wherein in each of the semiconductor chips, a first chip pad group corresponding to a first channel is on a first edge of the semiconductor chip, and a second chip pad group corresponding to a second channel is on a second edge of the semiconductor chip.

Each of the first and second channels may be for 32-bits, and each of the first and second chip pad groups may include pads for address terminals, pads for control terminals, and pads for data terminals in order to input/output 32-bit data.

The one or more semiconductor chips may include a first semiconductor chip and a second semiconductor chip. The first semiconductor chip may include a first chip pad group corresponding to a first channel on a first edge of the first semiconductor chip and a second chip pad group corresponding to a second channel on a second edge of the first semiconductor chip. The second semiconductor chip may include a third chip pad group corresponding to a third channel a second edge of the second semiconductor chip and a fourth chip pad group corresponding to a fourth channel on a fourth edge of the second semiconductor chip. The second semiconductor chip may be disposed on the first semiconductor chip such that the third and fourth chip pad groups are arranged to cross the first or second chip pad group at an angle of 90°.

The semiconductor package may further include a lower substrate disposed under the substrate and on which one or more semiconductor chips are mounted, and a connection member disposed between substrates and is configured to support the substrate and configured to connect the substrate to the lower substrate, wherein the one or more semiconductor chips on the substrate may be logic chips, and the one or more semiconductor chips on the lower substrate may be memory chips.

According to an example embodiment, a semiconductor package of a package on package (POP) structure includes a first package having at least one first semiconductor chip on a first substrate, the at least one first semiconductor having a plurality of IP cores, each IP core on each edge of the first semiconductor chip, each IP core configured to correspond to each channel, a second package on the first package, the second package having at least one second semiconductor chip on a second substrate, the at least one second semiconductor having groups of chip pads, each group of chip pads concentrated on each edge of the second semiconductor chip, each group of chip pads being in close proximity of each corresponding IP core, and a plurality of connection members between the first package and the second package, the connection members disposed outwardly around the second semiconductor chip, the connection members configured to electrically connect the second substrate to the first substrate.

The semiconductor package may further includes a plurality of wirings, the wirings configured to electrically connect a plurality of chip pads on the at least one second semiconductor chip to a plurality of bonding pads on the second substrate. The plurality of wirings is a plurality of through silicon vias (TSVs) in the at least one second semiconductor chip.

A peripheral area of the second substrate exposed by the at least one second semiconductor chip may be apportioned into a plurality of sub-areas according to a number of channels and each of a plurality of sub-areas in close proximity of a channel is configured to accommodate connection members corresponding to each channel.

BRIEF DESCRIPTION OF THE DRAWINGS

Example embodiments of the inventive concepts will be more clearly understood from the following detailed description taken in conjunction with the accompanying drawings in which.

Figure 1:
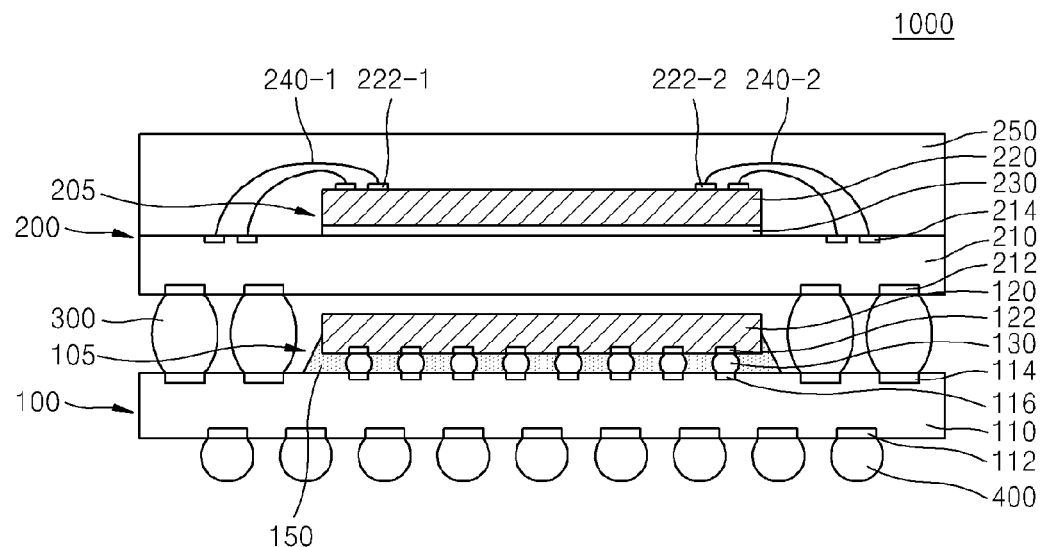
FIG. 1 is a cross-sectional view of a semiconductor package of a package on package (POP) structure according to an example embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Hereinafter, example embodiments of the present inventive concepts will be described in detail with reference to accompanying drawings.

Example embodiments now will be described more fully hereinafter with reference to the accompanying drawings, in which illustrative embodiments of the inventions are shown. Example embodiments may, however, be embodied in many different forms and should not be construed as limited to the embodiments set forth herein; rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. In the drawings, the thicknesses of layers and regions are exaggerated for clarity. The terminology used herein is for the purpose of describing particular embodiments only and is not intended to be limiting of the invention.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "and/or" includes any and all combinations of one or more of the associated listed items. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a semiconductor package 1000 having a package-on-package (POP) structure according to an embodiment.

Referring to FIG. 1, the semiconductor package 1000 may include a first package 100, a second package 200, and a connection member 300 between substrates. The semiconductor package 1000 of the present embodiment may have a POP structure in which the second package 200 is stacked on the first package 100, as shown in FIG. 1.

The first package 100 may include a first substrate 110 and a first semiconductor chip portion 105.

The first substrate 110 supports the first semiconductor chip portion 105. Pads may be formed in a lower surface and an upper surface of the first substrate 110. For example, lower pads 112 may be formed in the lower surface of the first substrate 110, and upper pads 114 and intermediate pads 116 may be formed in the upper surface of the first substrate 110. The first substrate 110 may be formed of silicon, glass, ceramic, or plastic. However, a material for forming the first substrate 110 is not limited thereto.

The first substrate 110 may be formed based on an active wafer or an interposer substrate. Here, the active wafer refers to a wafer from which a semiconductor chip may be formed, for example, a silicon wafer. In addition, the first substrate 110 may have a multi-layered structure, in which wiring patterns (not shown) are formed. The upper pads 114 and the intermediate pads 116 may be electrically connected to the lower pads 112 via the wiring patterns.

Meanwhile, an external connection member 400 for mounting a semiconductor package on an external device may be formed on each of the lower pads 112 in the lower surface of the first substrate 110.

The first semiconductor chip portion 105 may include a first semiconductor chip 120, connection members 130, and an underfill 150.

Chip pads 122 are formed in a lower surface of the first semiconductor chip 120. The first semiconductor chip 120 may be mounted on the first substrate 110 in a flip-chip form via the connection members 130 attached to the chip pads 122, respectively. That is, the connection members 130 physically and electrically connect the chip pads 122 to the intermediate pads 116.

The underfill 150 may be filled between the first semiconductor chip 120 and the first substrate 110. The underfill 150 may be formed of an underfill resin, e.g., an epoxy resin, and may include a silica filler or a flux. If necessary, an adhesive member may be formed between the first semiconductor chip and the first substrate 110, instead of the underfill 150. The adhesive member may be formed of, for example, a non-conductive film (NCF), an anisotropic conductive film (ACF), an ultraviolet ray (UV) film, an instant adhesive, a thermal-curable adhesive, a laser-curable adhesive, a supersonic wave-curable adhesive, or a non-conductive paste (NCP).

Figure 9:
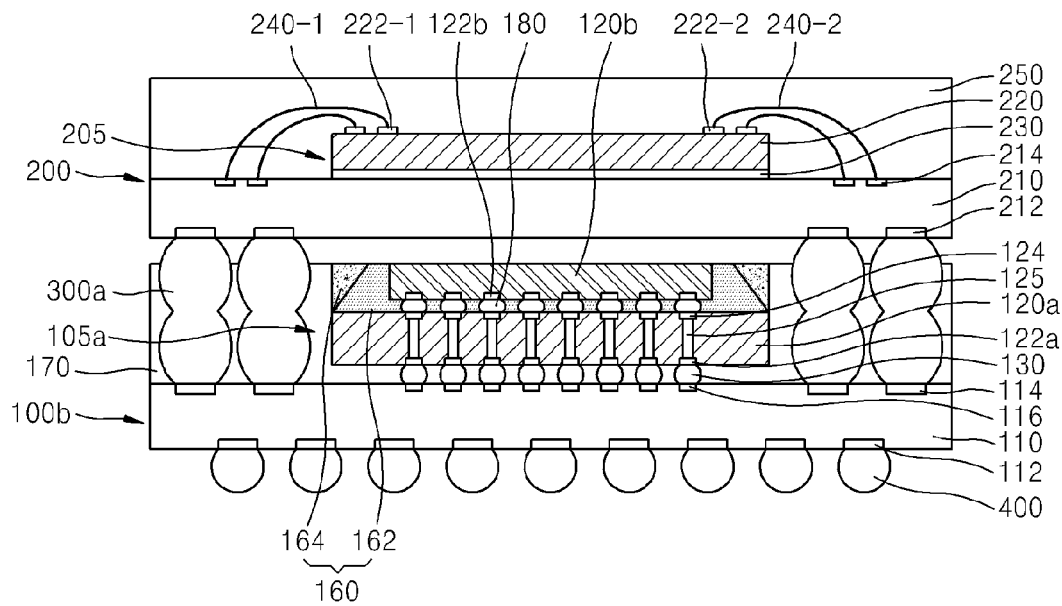

On the other hand, the first semiconductor chip portion 105 may include an external sealing material (not shown) surrounding the first semiconductor chip 120 and the underfill 150, like an external sealing material 164 of FIG. 9.

The second package 200 may include a second substrate 210, a second semiconductor chip portion 205, and a sealing material 250.

The first substrate 210 may be formed of silicon, glass, ceramic, or plastic, like the first substrate 110. However, the material for forming the second substrate 210 is not limited thereto. Pads may be formed in an upper surface and a lower surface of the second substrate 210. For example, bonding pads 214 may be formed in the upper surface of the second substrate 210, and connection pads 212 may be formed in the lower surface of the second substrate 210. In addition, the second substrate 210 may also include a multi-layered structure, in which wiring patterns (not shown) are formed. The bonding pads 214 may be electrically connected to the connection pads 212 via the wiring patterns.

The second semiconductor chip portion 205 may include a second semiconductor chip 220 and an adhesive 230. Chip pads 222-1 and 222-2 may be formed on an upper surface of the second semiconductor chip 220, and the chip pads 222-1 and 222-2 may be disposed on one edge of the second semiconductor chip 220 and on another edge of the second semiconductor chip 220 according to channels. For example, the chip pads 222-1 and 222-2 are partitioned according to the channels, and may be disposed on a right edge and a left edge of the second semiconductor chip 220, respectively.

The chip pads 222-1 and 222-2 may be electrically connected to the bonding pads 214 via wires 240-1 and 240-2, respectively. For example, the second semiconductor chip 220 may be mounted on the second substrate 210 in a wire-bonding form.

Here, the left and right chip pads and wires are denoted by different reference numerals because the left chip pads 222-1 and the wires 240-1 correspond to a first channel Ch.1 and the right chip pads 222-2 and the wires 240-2 correspond to a second channel Ch.2. The channels and the arrangement structure of the chip pads are described in more detail with reference to FIGS. 2 and 3.

The adhesive 230 may attach the second semiconductor chip 220 on the second substrate 210. The adhesive 230 may be an NCF, a UV film, an instant adhesive, a thermal-curable adhesive, a laser-curable adhesive, an ultrasonic wave-curable adhesive, or an NCP.

The sealing material 250 seals the second semiconductor chip 220 and the wires 240-1 and 240-2. The sealing material 250 may be formed of a polymer such as a resin. For example, the sealing material 250 may be formed of an epoxy molding compound (EMC).

The connection member 300 between substrates physically and electrically connects the upper pads 114 of the first substrate 110 and the connection pads 212 of the second substrate 210 to each other, and makes the first and second packages 100 and 200 structurally firm. The connection member 300 between substrates may be formed of, for example, a solder ball. However, the material for forming the connection member 300 is not limited to solder.

For example, the connection member 300 between substrates may include at least one of tin (Sn), silver (Ag), copper (Cu), and aluminum (Al). In addition, the structure of the connection member 300 between substrates is not limited to the ball shape shown in the drawings. For example, the connection member 300 between substrates may be modified variously as a cylinder, a polygonal pillar, or a polyhedron. Moreover, the connection member 300 between substrates may be two or more solder balls, not one solder ball. For example, the connection member 300 between substrates may be formed to have a structure, in which a lower solder ball and an upper solder ball are coupled to each other, as in semiconductor packages shown in FIGS. 7 through 9.

In the semiconductor package 1000 of the present embodiment, the first semiconductor chip portion 105 and the second semiconductor chip portion 205 respectively include only one semiconductor chip; however, the present inventive concept is not limited thereto, and at least one of the first and second semiconductor chip portions 105 and 205 may include a plurality of semiconductor chips. Example embodiments where the first semiconductor chip portion 105 and/or the second semiconductor chip portion 205 include a plurality of semiconductor chips are described with reference to FIGS. 5 through 13.

In addition, in the semiconductor package 1000 of the present embodiment, the first semiconductor chip 120 and the second semiconductor chip 220 may be the same kind of semiconductor chips or different kinds of chips. For example, the first semiconductor chip 120 may be a logic chip, and the second semiconductor chip 220 may be a memory chip.

The logic chip may be a micro-processor, for example, may be a central processing unit (CPU), a controller, or an application specific integrated circuit (ASIC). In addition, the first semiconductor chip 120 may be an application processor (AP) chip of a system on chip (SoC) type used in a mobile system, for example, a mobile phone, an MP3 player, a navigation device, or a portable multi-media player (PMP).

The memory chip may be a volatile memory, e.g., a dynamic random access memory (DRAM) and a static random access memory (SRAM), or a non-volatile memory, e.g., a flash memory. In addition, the second semiconductor chip 220 may be a double data rate (DDR) synchronous dynamic random access memory (SDRAM) chip (hereinafter, referred to as a DDR chip) used in a mobile system.

According to the semiconductor package 1000 of the present embodiment, the chip pads 222-1 and 222-2 of the second semiconductor chip 220, for example, DDR chips, are classified by channels and arranged on opposite edges. Thus, connections to the first semiconductor chip 120, for example, an AP chip, disposed under the second semiconductor chip 220 may be simplified. Accordingly, a thickness of the second substrate 210 may be reduced, and thus, an overall thickness of the semiconductor package 1000 may be reduced.

Figure 2:
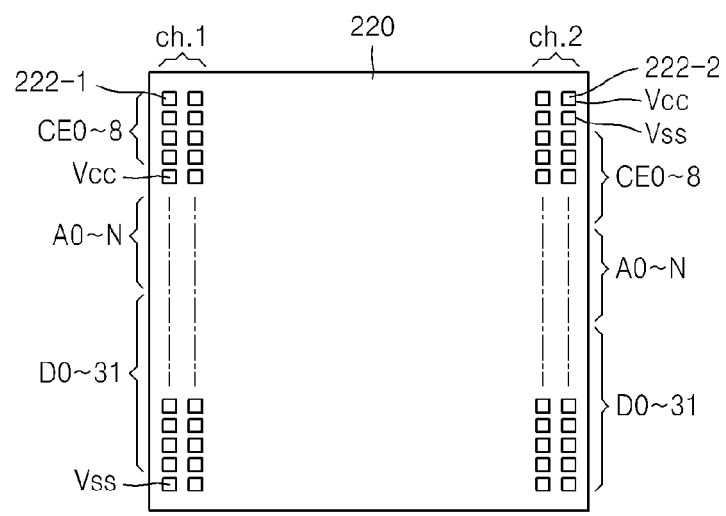
FIG. 2 is a plan view showing arrangement of chip pads according to channels on a second semiconductor chip that is mounted on a second package of the semiconductor package of FIG. 1.

FIG. 2 is a plane view showing arrangement of the chip pads 222-1 and 222-2 according to the channels on the second semiconductor chip 220 mounted on the second package 200 of the semiconductor package of FIG. 1.

Referring to FIG. 2, the second semiconductor chip 220 of the semiconductor package 1000 of the present embodiment may be a DDR chip described above. The second semiconductor chip 220 may include the first chip pads 222-1 for the first channel Ch.1 on a left edge portion and the second chip pads 222-2 for the second channel Ch.2 formed on a right edge portion thereof.

The first channel Ch.1 and the second channel Ch.2 are respectively channels for 32 bits, and accordingly, each of the first chip pads 222-1 and the second chip pads 222-2 may include address terminal pads A0 to AN, control terminal pads CE0 to CE8, and data terminal pads D0 to D31 for inputting/outputting 32-bit data. Each of the first chip pads 222-1 and each of the second chip pads 222-2 may include a power voltage terminal Vcc for applying a power voltage and a ground terminal Vss for applying a ground voltage.

As described above, 32-bit data is input/output through the first channel Ch.1 and the second channel Ch.2, and thus, the second semiconductor chip 220, for example, the DDR chip, may be a 64-bit DDR chip.

In FIG. 2, the first chip pads 222-1 and the second chip pads 222-2 are arranged on the left and right edge portions in two rows, respectively; however, the arrangements of the first and second chip pads 222-1 and 222-2 are not limited thereto. For example, the first chip pads 222-1 or the second chip pads 222-2 may be arranged in one or more rows, respectively. In addition, arranging orders of the address terminal pads A0 to AN, the control terminal pads CE0 to CE8, and the data terminal pads D0 to D31 may be arbitrarily changed according to a structure of an integrated circuit in the second semiconductor chip 220.

In FIG. 2, the address terminal pads A0 to AN, the control terminal pads CE0 to CE8, and the data terminal pads D0 to D31 of the first chip pads 222-1 and the address terminal pads A0 to AN, the control terminal pads CE0 to CE8, and the data terminal pads D0 to D31 of the second chip pads 222-2 are not symmetrically arranged with each other, but may be symmetrically arranged. On the other hand, one power voltage terminal Vcc and one ground terminal Vss are disposed in each of the first chip pads 222-1 and each of the second chip pads 222-2; however, a plurality of power voltage terminals or a plurality of ground terminals may be disposed.

In the semiconductor package 1000 of the present embodiment, because the chip pads 222-1 and 222-2 of the second semiconductor chip 220 are arranged on the opposite edges thereof according to channels for 32-bits, the second semiconductor chip 220 may be simply connected to the first semiconductor chip 120. In more detail, in a conventional 32-bit DDR chip, chip pads corresponding to one channel are only formed on one edge, and the data terminal pads and the address terminal and control terminal pads are disposed on an opposite edge. On the other hand, in a general AP chip, DDR intellectual property (IP) core portions corresponding to one channel are arranged on one edge. Accordingly, wiring connection between a 32-bit DDR chip and an AP chip is complicated. For example, a plurality of wiring layers are formed in the substrate on which the DDR chip is mounted, and the 32-bit DDR chip and the AP chip are connected to each other via the plurality of wiring layers. In particular, as the number of channels increases, design complexity of the wiring layers in the substrate also increases. For example, when there are four channels, four DDR chips are stacked, and in order to connect the four DDR chips to the AP chip, at least six or more wiring layers have to be formed in the substrate on which the DDR chips are mounted. Accordingly, the substrate becomes thick.

However, according to the semiconductor package 1000 of the present embodiment, the 32-bit chip pads corresponding to two channels are disposed on opposite sides of on one DDR chip, and each of the DDR IP core portions corresponding to each of the channels are disposed on each edges of the AP chip, which is adjacent to each corresponding group of chip pads. Thus, the wiring connection between the DDR chip and the AP chip may be simplified. Accordingly, a thickness of a substrate on which the DDR chip is mounted may be reduced, and the number of the DDR chips may be reduced by half. For example, when four channels are used, two DDR chips respectively including chip pads for two channels are stacked in order to configure a four-channel semiconductor package.

Figure 3:
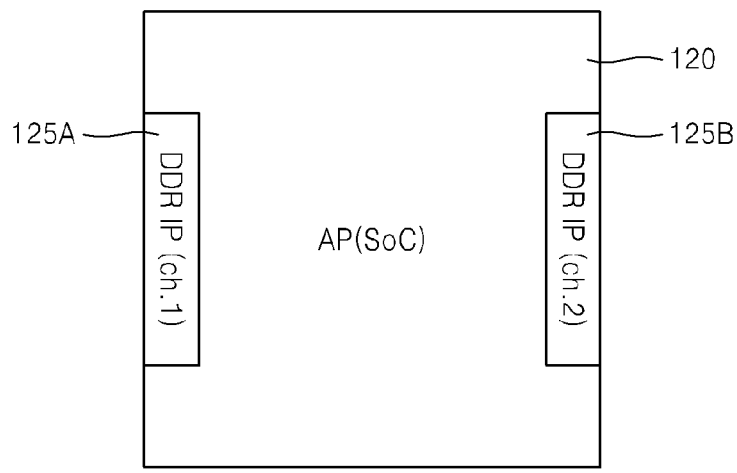
FIG. 3 is a plan view showing a location of DDR IP cores according to channels of a first semiconductor chip mounted on a first package of the semiconductor package of FIG. 1.

FIG. 3 is a plane view showing locations of DDR IP cores 125A and 125B according to channels in the first semiconductor chip 120 mounted on the first package 100 of the semiconductor package 1000 of FIG. 1.

Referring to FIG. 3, in the semiconductor package 1000 of the present embodiment, the DDR IP cores 125A and 125B in the first semiconductor chip 120, for example, the AP chips, may be disposed to correspond to the chip pads 222-1 and 222-2 arranged on the second semiconductor chip 220, for example, the DDR chip. For example, the DDR IP core 125A for the first channel Ch.1 may be disposed on a left edge portion of the first semiconductor chip 120 in order to correspond to the chip pads 222-1 for the first channel Ch.1, and the DDR IP core 125B for the second channel Ch.2 may be disposed on a right edge portion of the first semiconductor chip 120 in order to correspond to the chip pads 222-2 for the second channel Ch.2. As described above, wiring connections between the chip pads of the DDR chip and the DDR IP cores of the AP chip may be simplified by arranging the IP cores 125A and 125B with respect to the chip pads 222-1 and 222-2, respectively, according to channels.

Figure 4:
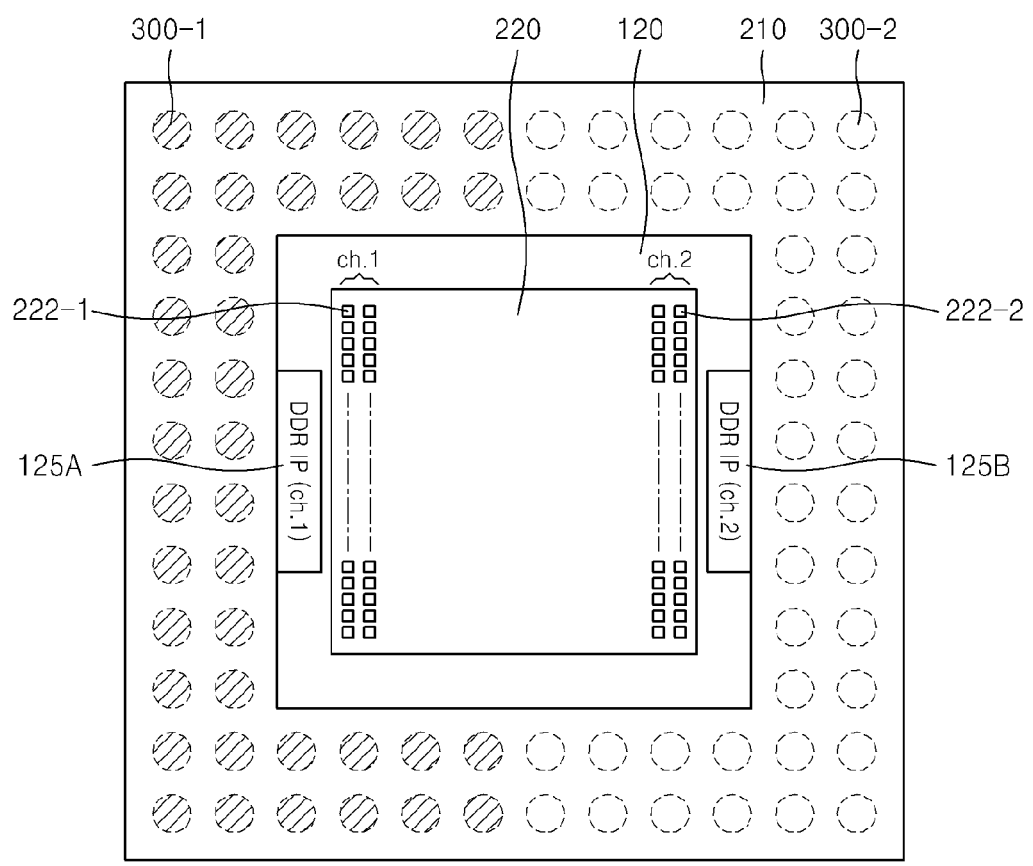
FIG. 4 is a conceptual view showing relative locations between first chip pads of the second semiconductor chip mounted on the second package, the DDR IP cores of the first semiconductor chip mounted on the first package, and a connection member disposed on a lower surface of a second substrate in the semiconductor package of FIG. 1.

FIG. 4 is a conceptual view showing relative locations between the chip pads 222-1 and 222-2 of the second semiconductor chip 220 on the second package 200, the DDR IP cores 125A and 125B of the first semiconductor chip 120 on the first package 100, and the connection member 300 disposed on the lower surface of the second substrate 210 in the semiconductor package 1000 of FIG. 1.

Referring to FIG. 4, in the semiconductor package 1000 of the present embodiment, the DDR IP core 125A for the first channel of the first semiconductor chip 120 is disposed adjacent to the chip pads 222-1 for the first channel Ch.1 of the second semiconductor chip 220. In addition, the DDR IP core 125B for the second channel in the first semiconductor chip 120 is disposed adjacent to the chip pads 222-2 for the second channel Ch.2 in the second semiconductor chip 220.

The connection member 300 between substrates that is disposed under the second substrate 210 on which the second semiconductor chip 220 is mounted is shown as dashed line circles. Among the circles, left hatched circles denote a connection member 300-1 corresponding to the first channel, and right non-hatched circles denote a connection member 300-2 corresponding to the second channel.

As shown in FIG. 4, the first semiconductor chip 120 may be bigger than the second semiconductor chip 220, for the convenience of describing the location relationships between the chip pads and the DDR IP cores. Thus, the first semiconductor chip 120 may be the same size as the semiconductor chip 220 or smaller. In addition, as shown in FIG. 1, the first semiconductor chip 120 is mounted on the first substrate 110 and is disposed under the second substrate 210; however, for the convenience of description, FIG. 4 illustrates as if the first semiconductor chip 120 is on the second substrate 210, which has the second semiconductor chip 220 thereon.

Hereinafter, the components previously described with reference to FIG. 1 will be briefly described or omitted.

FIGS. 5 through 10 are cross-sectional views of semiconductor packages that have a POP structure according to an example embodiment.

Figure 5:
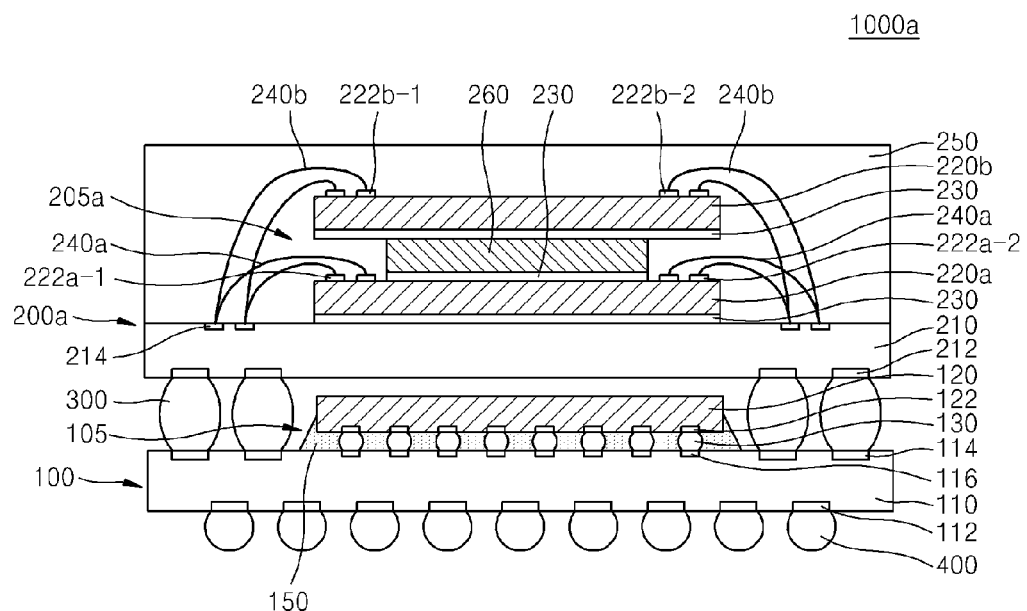
FIGS. 5 through 10 are cross-sectional views of semiconductor packages of a package on package (POP) structure according to example embodiments.

Referring to FIG. 5, a semiconductor package 1000a of the present embodiment is the same as the semiconductor package 1000 of FIG. 1 except for a second package 200a.

In more detail, the second package 200a may include two semiconductor chips, for example, a 2-1 semiconductor chip 220a and a 2-2 semiconductor chip 220b that are stacked on the second substrate 210.

The 2-1 semiconductor chip 220a and the 2-2 semiconductor chip 220b may have the same structures. Accordingly, in each of the 2-1 semiconductor chip 220a and the 2-2 semiconductor chip 220b, chip pads may be formed on opposite edges according to channels. For example, 1-1 chip pads 222a-1 corresponding to a first channel may be disposed on a left edge portion of the 2-1 semiconductor chip 220a, and 2-1 chip pads 222a-2 corresponding to the a second channel may be disposed on a right edge portion of the 2-1 semiconductor chip 220a. In addition, 1-2 chip pads 222b-1 corresponding to the a first channel may be disposed on a left edge portion of the 2-2 semiconductor chip 220b, and 2-2 chip pads 222b-2 corresponding to a second channel may be disposed on a right edge portion of the 2-2 semiconductor chip 220b.

The 1-1 chip pads 222a-1 and the 1-2 chip pads 222b-1 are connected to bonding pads 214 disposed in a left portion of the second substrate 210, respectively, through corresponding wires 240a and 240b for the first channel, and the 2-1 chip pads 222a-2 and the 2-2 chip pads 222b-2 may be connected to the bonding pads 214 disposed in a right portion of the second substrate 210, respectively, through corresponding wires 240a and 240b for the second channel.

The 2-2 semiconductor chip 220b may be stacked on the 2-1 semiconductor chip 220a via an interposer 260. Each of the 2-1 semiconductor chip 220a, the interposer 260, and the 2-2 semiconductor chip 220b may be attached to the second substrate 210, the 2-1 semiconductor chip 220a, and the interposer 260 by using the adhesive 230, respectively. According to other example embodiments, the 2-2 semiconductor chip 220b may be directly stacked on the 2-1 semiconductor chip 220a without using the interposer 260. When the 2-2 semiconductor chip 220b is directly stacked on the 2-1 semiconductor chip 220a, the adhesive 230 may be applied thick on the 2-1 semiconductor chip 220a in order to ensure a wire-bonding space of the 2-1 semiconductor chip 220a.

The 2-1 semiconductor chip 220a and the 2-2 semiconductor chip 220b may be the same kinds of memory chips or different kinds of memory chips. For example, the 2-1 semiconductor chip 220a and the 2-2 semiconductor chip 220b may be both DDR chips. As described above, because the 2-1 semiconductor chip 220a and the 2-2 semiconductor chip 220b are stacked and are arranged to share the channels, a memory capacity of the semiconductor package 1000a may be increased.

In the semiconductor package 1000a of the present embodiment, two semiconductor chips are stacked; however, the present embodiment is not limited thereto. For example, three or more semiconductor chips may be stacked on the second substrate 210. Each of the semiconductor chips may be connected to the bonding pads 214 of the second substrate 210, as shown in FIG. 5, by sharing the channels.

Figure 6:
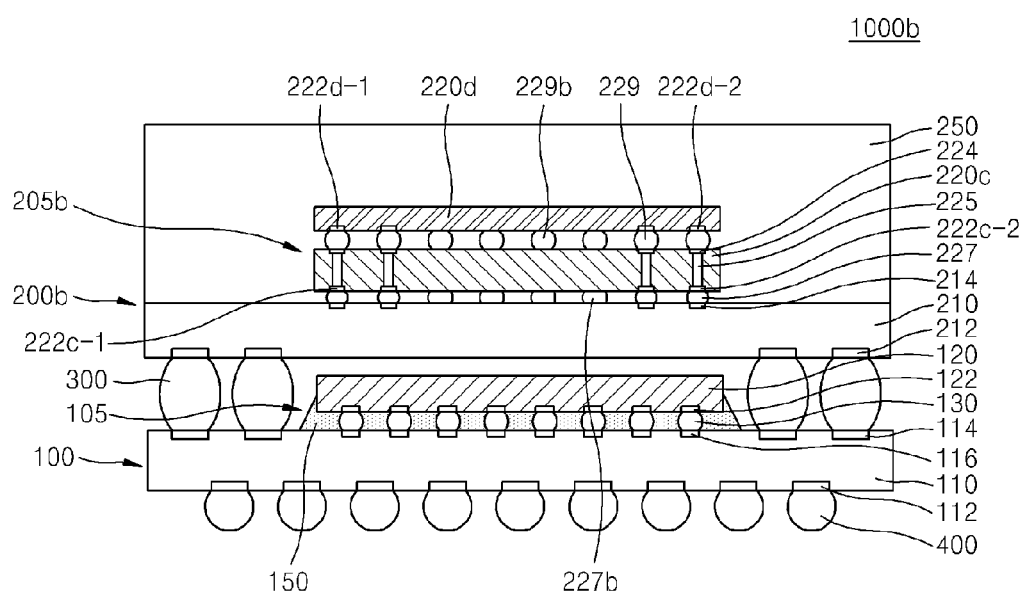

Referring to FIG. 6, a semiconductor package 1000b of the present embodiment may be the same as the semiconductor package 1000 of FIG. 1 except for a second package 200b.

The second package 200b may include two semiconductor chips 220c and 220d stacked on the second substrate 210.

The 2-1 semiconductor chip 220c and the 2-2 semiconductor chip 220d may be mounted on the second substrate 210 in a flip-chip bonding form. Accordingly, the 2-1 semiconductor chip 220c and the 2-2 semiconductor chip 220d may be stacked such that active surfaces on which chip pads are formed face the second substrate 210.

In more detail, 1-1 chip pads 222c-1 corresponding to the first channel may be formed in the left of an active surface of the 2-1 semiconductor chip 220c, and 2-1 chip pads 222c-2 corresponding to the second channel may be formed in the right of the active surface of the 2-1 semiconductor chip 220c. Each of the 1-1 chip pads 222c-1 and the 2-1 chip pads 222c-2 may be connected to the corresponding bonding pads 214 of the second substrate 210 through first connection members 227, for example, bumps. Through silicon vias (TSVs) 225 may be formed in the 2-1 semiconductor chip 220c. The TSVs 225 may electrically connect upper pads 224 and the chip pads 222c-1 and 222c-2 of the 2-1 semiconductor chip 220c to each other.

In addition, 1-2 chip pads 222d-1 corresponding to the first channel are formed in the left of an active surface of the 2-2 semiconductor chip 220d, and 2-2 chip pads 222d-2 corresponding to the second channel may be formed in the right of the active surface of the 2-2 semiconductor chip 220d. Each of the 1-2 chip pads 222d-1 and the 2-2 chip pads 222d-2 may be connected the corresponding upper pads 224 of the 2-1 semiconductor chip 220c through second connection members 229, for example, bumps. That is, the 1-2 chip pads 222d-1 and the 2-2 chip pads 222d-2 of the 2-2 semiconductor chip 220d may be electrically connected to the corresponding bonding pads 214 of the second substrate 210 via the second connection members 229, the TSVs 225, and the first connection members 227.

In the semiconductor package 1000b of the present embodiment, the chip pads are arranged on opposite edge portions of the semiconductor chips 220c and 220d that are mounted on the second substrate 210 according to the channels, and thus, the wiring connection between the semiconductor chips 220c and 220d and the first semiconductor chip 210 may be simplified. Accordingly, a thickness of the second substrate 210 may be thin.

In the semiconductor package 1000b of the present embodiment, two semiconductor chips are stacked on the second substrate 210; however, the number of stacked semiconductor chips is not limited thereto. For example, three or more semiconductor chips may be stacked. In order to stack the semiconductor chips in the flip-chip form, the TSVs may be formed in lower semiconductor chips, except for the uppermost semiconductor chip. Here, the connection members that are not connected to the chip pads may be dummy connection members 227b and 229b simply for supporting and attaching the semiconductor chips.

When comparing the semiconductor package 1000b of the present embodiment with the semiconductor package 1000a shown in FIG. 5, the semiconductor packages 1000a and 1000b are different in that the semiconductor chips are mounted on the second substrate in a wire-bonding form or in the flip-chip bonding form. Mounting the semiconductor chips in a flip-chip form is advantageous in reducing the thickness of the semiconductor package. For example, in the present embodiment, an upper surface of the 2-2 semiconductor chip 220d is covered by the sealing material 250; however, the upper surface of the 2-2 semiconductor chip 220d may be exposed through the sealing material 250 in order to reduce the thickness of the semiconductor package 1000b. Because the 2-2 semiconductor chip 220d is mounted in the flip-chip form, the upper surface of the 2-2 semiconductor chip 220d is not an active surface. Thus, the upper surface of the 2-2 semiconductor chip 220d may be exposed to the outside.

Figure 7:
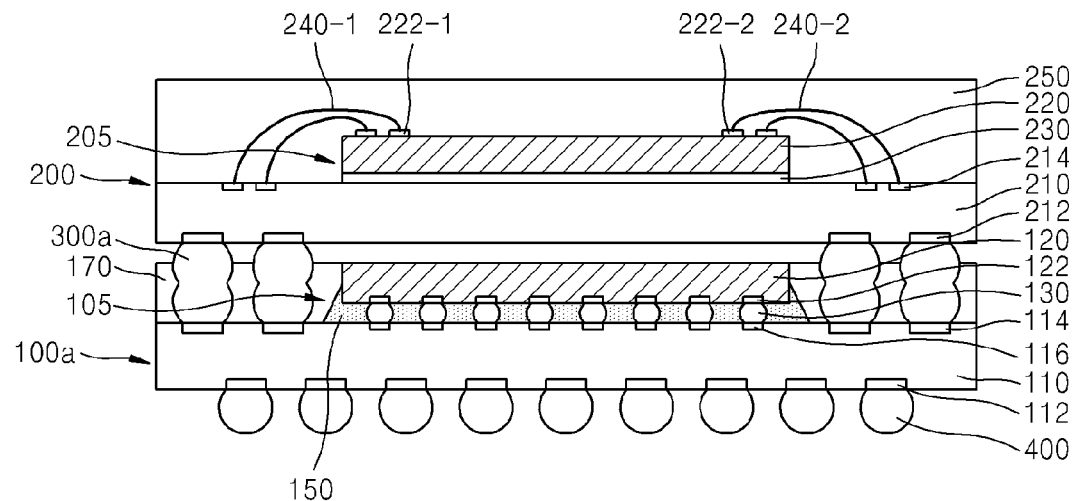

Referring to FIG. 7, a semiconductor package 1000c of the present embodiment may be the same as the semiconductor package 1000 shown in FIG. 1 except for a connection member 300a between substrates.

The connection member 300a between substrates may be formed by stacking two solder balls, unlike the connection member 300 of the semiconductor package 1000 shown in FIG. 1. The material forming the connection member 300a between the substrates may be the same as that used in the semiconductor package 1000 of FIG. 1.

On the other hand, because the connection member 300a between substrates is formed by stacking two solder balls, a lower sealing material 170 may be formed on the first package 100a in order to support the connection member 300a between substrates. For example, the lower sealing material 170 may be formed to surround side surfaces of the first semiconductor chip 120, the underfill 150, and the connection member 300a between substrates. The material forming the lower sealing material 170 may be the same as or different from the material forming the underfill 150. If the lower sealing material 170 is formed in a molded underfill (MUF) process, the underfill 150 may be omitted.

A part of the upper solder ball in the connection member 300a may not be surrounded by the lower sealing material 170. In addition, as shown in FIG. 7, the upper surface of the first semiconductor chip 120 may be exposed through the lower sealing material 170. However, according to other example embodiments, the lower sealing material 170 may be formed to cover the first semiconductor chip 120.

Figure 8:
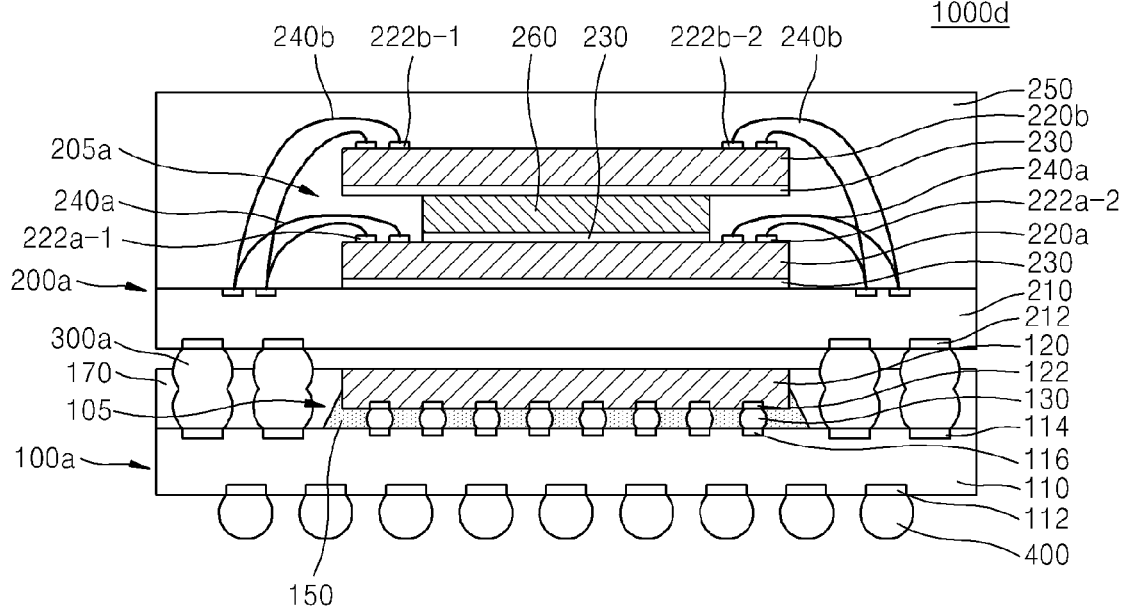

Referring to FIG. 8, a semiconductor package 1000d of the present embodiment may be the same as the semiconductor package 1000c shown in FIG. 7 except for a second package 200a.

The second package 200a may include two semiconductor chips 220a and 220b mounted on the second substrate 210 in a wire-bonding form, like in the semiconductor package 1000a shown in FIG. 5. However, in the semiconductor package 1000d of the present embodiment, the number of semiconductor chips mounted on the second substrate 210 is not limited two. For example, three or more semiconductor chips may be stacked on the second substrate 210. In addition, the semiconductor chips may be mounted in a flip-chip form and not a wire-bonding form, like in the semiconductor package 1000b of FIG. 6.

Referring to FIG. 9, a semiconductor package 1000e according to the present embodiment may be the same as the semiconductor package 1000c shown in FIG. 7 except for a first package 100b, in particular, a first semiconductor chip portion 105a.

The first package 100b may include the first semiconductor chip portion 105a mounted on the first substrate 110. The first semiconductor chip portion 105a may be mounted on the first substrate 110 in a flip-chip form similarly to the first semiconductor chip portion 105 in the semiconductor package shown in FIGS. 1 through 8.

The first semiconductor chip portion 105a may include a 1-1 semiconductor chip 120a and a 1-2 semiconductor chip 120b. The 1-1 semiconductor chip 120a may be mounted on the first substrate 110 in a flip-chip form via the connection member 130, and may include the TSVs 125 therein. The TSVs 125 may electrically connect the upper pads 124 and the chip pads 122a formed on upper and lower surfaces of the 1-1 semiconductor chip 120a to each other.

The 1-2 semiconductor chip 120b may be stacked on the 1-1 semiconductor chip 120a in a flip-chip form through a third connection member 180. The third connection member 180 may physically and electrically connect the chip pads 122b formed in a lower surface of the 1-2 semiconductor chip 120b and the upper pads 124 formed in the upper surface of the 1-1 semiconductor chip 120a to each other, thereby attaching the 1-2 semiconductor chip 120b firmly on the 1-1 semiconductor chip 120a.

The 1-2 semiconductor chip 120b may be surrounded by an internal sealing material 160. The internal sealing material 160 may include an underfill 162 and the external sealing material 164. The underfill 162 fills a connecting space between the 1-1 semiconductor chip 120a and the 1-2 semiconductor chip 120b, for example, a portion where the third connection member 180 is disposed. The external sealing material 164 may surround side surfaces of the underfill 162. In FIG. 9, the underfill 162 surrounds all side surfaces of the 1-2 semiconductor chip 120b; however, a part of the side surfaces or the side surfaces may not be surrounded by the underfill 162. In this case, the external sealing material 164 may surround exposed side surfaces of the 1-2 semiconductor chip 120b.

The lower sealing material 170 may surround the first semiconductor chip portion 105a, and the connection member 300a, as shown in the semiconductor package 1000c of FIG. 7. The lower sealing material 170 may expose an upper surface of the first semiconductor chip portion 105a, for example, the upper surface of the 1-2 semiconductor chip 120b. According to other example embodiments, the lower sealing material 170 may be formed to surround the upper surface of the first semiconductor chip portion 105a.

The connection member 300a between substrates may be formed by stacking two solder balls; however, the connection member may be formed of one solder ball like in the semiconductor package 1000 of FIG. 1. In this case, the lower sealing material 170 may not be formed as shown in the semiconductor package 1000 of FIG. 1.

Figure 10:
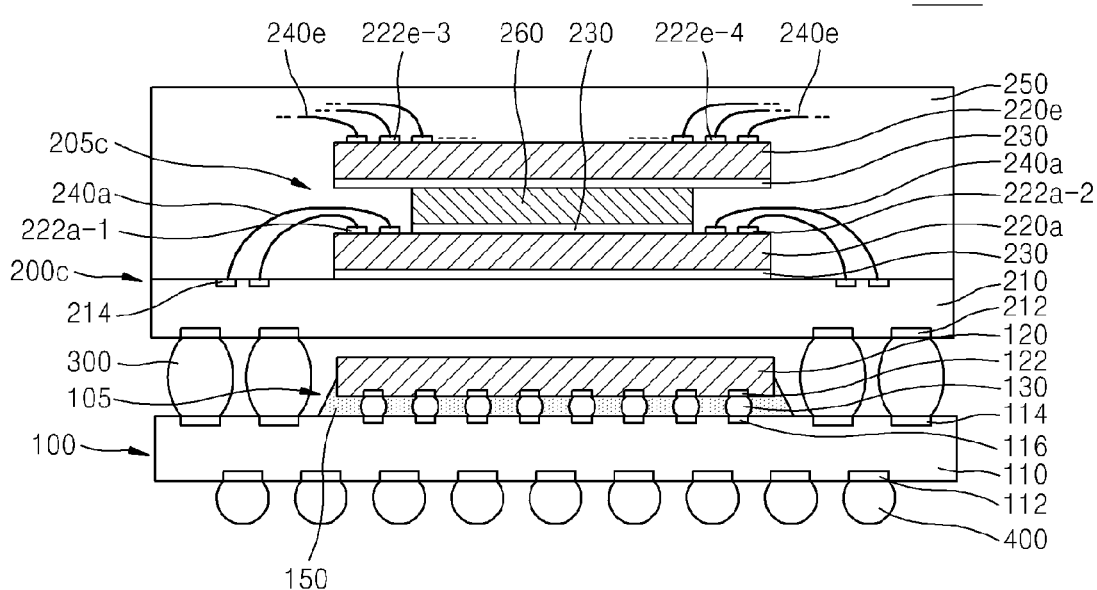

Referring to FIG. 10, a semiconductor package 1000f of the present embodiment is similar to the semiconductor package 1000a shown in FIG. 5 in that the two semiconductor chips are stacked on the second substrate 210; however, the semiconductor package 1000f of the present embodiment may be different from the semiconductor package 1000a in that four channels, not two channels, are used.

In more detail, a second package 200c may include two semiconductor chips 220a and 220e mounted on the second substrate 210 through a wire-bonding process. The two semiconductor chips 220a and 220e, for example, a 2-1 semiconductor chip 220a and a 2-2 semiconductor chip 220e, may be stacked with the interposer 260 therebetween, like in the semiconductor package 1000a of FIG. 5.

Figure 11:
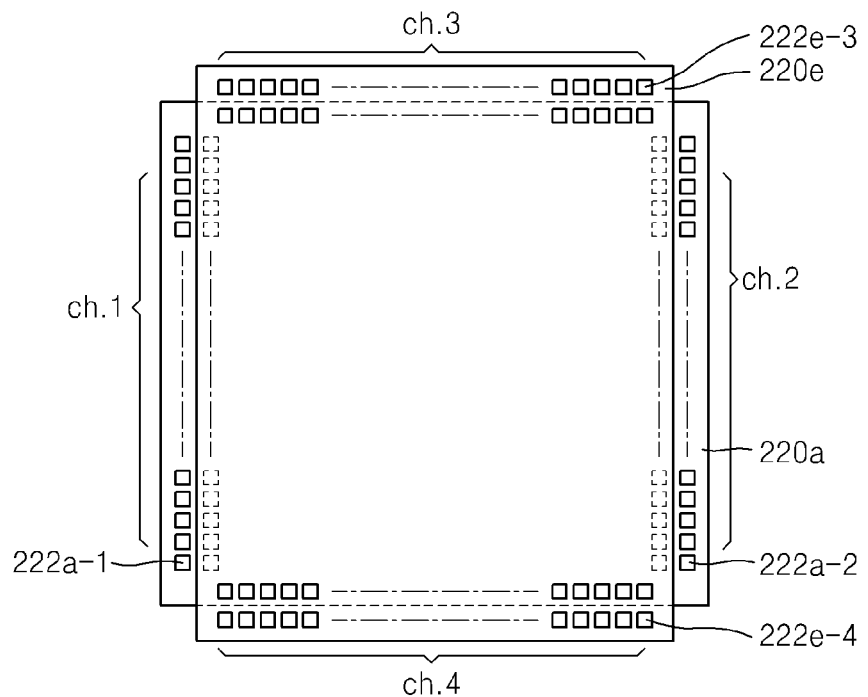
FIG. 11 is a plan view showing chip pad arrangement according to channels of semiconductor chips mounted on a second package of the semiconductor package of FIG. 10.

The 2-1 semiconductor chip 220a may be the same as the 2-1 semiconductor chip 220a in the semiconductor package 1000a of FIG. 5. The arrangement of chip pads on the 2-2 semiconductor chip 200e may be different from that of the 2-2 semiconductor chip 220b of the semiconductor package 1000a shown in FIG. 5 in that channels connected to the 2-2 semiconductor chip 200e are different from those connected to the 2-2 semiconductor chip 220b. For example, chip pads 222e-3 and 222e-4 disposed on opposite edges of the 2-2 semiconductor chip 200e are chip pads for a third channel Ch.3 and a fourth channel Ch.4. In addition, the chip pads 222e-3 and 222e-4 of the semiconductor chip 200e may not be disposed on left and right edges, and may be disposed on front and rear edges. Accordingly, the chip pads 222e-3 and 222e-4 of the 2-2 semiconductor chip 200e may be arranged at an angle of 90° with respect to the chip pads 222a-1 and 222a-2 of the 2-1 semiconductor chip 220a. The arrangement of the chip pads is shown in FIG. 11.

In FIG. 10, the chip pads 222e-3 and 222e-4 of the semiconductor chip 200e are shown in left and right portions, for the convenience of description; however, the left chip pads 222e-3 are arranged on a front edge of the semiconductor chip 220e, and right chip pads 222e-4 are arranged on a rear edge of the 2-2 semiconductor chip 220e.

The chip pads 222a-1 and 222a-2 of the 2-1 semiconductor chip 220a and the chip pads 222e-3 and 222e-4 of the 2-2 semiconductor chip 220e may be electrically connected to the bonding pads 214 that are arranged in four edges of the second substrate 210 respectively through corresponding wires 240a and 240e. Therefore, the chip pads 222a-1 and 222a-2 of the 2-1 semiconductor chip 220a and the chip pads 222e-3 and 222e-4 of the 2-2 semiconductor chip 220e may be electrically connected to DDR IP cores of the four channels, which are arranged on four edges of the first semiconductor chip 120 mounted on the first substrate 110, respectively through the wires 240a and 240e, the second substrate 210, the connection member 300 between substrates, and the first substrate 110.

In the present embodiment, one 2-1 semiconductor chip 220a corresponding to the first and second channels Ch.1 and Ch.2 and one 2-2 semiconductor chip 220e corresponding to the third and fourth channels Ch.3 and Ch.4 are stacked on the second substrate 210; however, the number of semiconductor chips is not limited thereto. For example, two or more semiconductor chips corresponding to the first and second channels Ch.1 and Ch.2 may be stacked, and two or more semiconductor chips corresponding to the third and fourth channels Ch.3 and Ch.4 may be stacked. The chip pads formed on the semiconductor chips may be disposed on opposite edges according to each channel. For example, in the semiconductor chips corresponding to the first and second channels Ch.1 and Ch.2, the chip pads may be disposed on left and right edges, and in the semiconductor chips corresponding to the third and fourth channels Ch.3 and Ch.4, the chip pads may be disposed on front and rear edges.

On the other hand, the 2-1 semiconductor chip 220a and the 2-2 semiconductor chip 220e may be the same kinds of memory chips. For example, the 2-1 semiconductor chip 220a and the 2-2 semiconductor chip 220e may be DDR chips.

In the semiconductor package 1000f of the present embodiment, the chip pads in each of the semiconductor chips are disposed on opposite edges according to the two channels, and the chip pads 222a-1 and 222a-2 of the 2-1 semiconductor chip 220a and the chip pads 222e-3 and 222e-4 of the 2-2 semiconductor chip 220e are arranged at an angle of 90° with respect to each other. Thus, wiring connections of the 2-1 and 2-2 semiconductor chips 220a and 220e to the first semiconductor chip 120 disposed thereunder may be simplified, and accordingly an overall thickness of the semiconductor package 1000f may be greatly reduced.

FIG. 11 is a plan view showing arrangements of the chip pads according to channels in semiconductor chips mounted on the second package 200c of the semiconductor package 1000f of FIG. 10.

Referring to FIG. 11, the 2-1 semiconductor chip 220a and the 2-2 semiconductor chip 220e of the semiconductor package 1000f of the present embodiment may be DDR chips. The 2-1 semiconductor chip 220a may include the first chip pads 222a-1 for the first channel Ch.1 and the second chip pads 222a-2 for the second channel Ch.2 that are formed on left and right edges, respectively. In addition, the 2-2 semiconductor chip 220e may include the third chip pads 222e-3 for the third channel Ch.3 and the fourth chip pads 222e-4 for the fourth channel Ch.4 that are formed on front and rear edges, respectively s.

Each of the first channel Ch.1 through the fourth channel Ch.4 is a channel for 32-bits. Accordingly, each of the first chip pads through the fourth chip pads 222a-1, 222a-2, 222e-3, and 222e-4 may include address terminal pads, control terminal pads, and data terminal pads for inputting/outputting 32-bit data. In addition, each of the first chip pads through the fourth chip pads 222a-1, 222a-2, 222e-3, and 222e-4 may respectively include a power voltage terminal Vcc for applying a power voltage and a ground terminal Vss for applying a ground voltage.

Because the 2-1 semiconductor chip 220a inputs/outputs 32-bit data through the first and second channels Ch.1 and Ch.2 and 2-2 semiconductor chip 220e inputs/outputs 32-bit data through the third and fourth channels Ch.3 and Ch.4, the 2-1 semiconductor chip 220a and the 2-2 semiconductor chip 220e may be respectively a 64-bit DDR chip.

In FIG. 11, the first chip pads 222a-1 and the second chip pads 222a-2 of the 2-1 semiconductor chip 220a may be arranged in two rows on left and right edges, and the third chip pads 222e-3 and the fourth chip pads 222e-4 of the 2-2 semiconductor chip 220e may be arranged in two rows on front and rear edges. However, the arrangements of the first through fourth chip pads 222a-1, 222a-2, 222e-3, and 222e-4 are not limited thereto. For example, each of the first through fourth chip pads 222a-1, 222a-2, 222e-3, and 222e-4 may be arranged in one or more rows. In addition, the order of arranging the address terminal pads, the control terminal pads, and the data terminal pads may be arbitrary according to a structure of an integrated circuit in each of the 2-1 semiconductor chip 220a and the 2-2 semiconductor chip 220e. On the other hand, a plurality of power voltage terminals Vcc and a plurality of ground terminals Vss may be disposed in each of the first through fourth chip pads 222a-1, 222a-2, 222e-3, and 222e-4.

In the semiconductor package 1000f of the present embodiment, the chip pads of the 2-1 semiconductor chip and the 2-2 semiconductor chip are disposed on the left and right edges and on the front and rear edges according to the channels for 32-bits, and thus, the wire connections between the 2-1 and 2-2 semiconductor chips 220a and 220e and the first semiconductor chip 120 may be simplified. In a conventional 32-bit DDR chip, chip pads corresponding to one channel are only formed, and the data terminal pads and the address terminal pads and the control terminal pads are arranged in opposite edges to each other. In a general AP chip, the DDR IP cores corresponding to one channel have to be concentrated on one edge. Accordingly, when four channels are used, four DDR chips have to be stacked, and the wires for connecting the four DDR chips to the AP chip become very complex. In addition, because the wire connections need to be implemented in the internal wiring layer of the second substrate 210, at least six or more wiring layers have to be formed on the second substrate. Accordingly, the thickness of the second substrate 210 is increased, thereby increasing the overall thickness of the semiconductor package.

However, according to the semiconductor package 1000f of the present embodiment, the 32-bit chip pads corresponding to two channels may be disposed on left and right, or front and rear edges of the DDR chip in each of the DDR chips, and each of the DDR IP core portions of the AP chip corresponding to the channels may be disposed on each of the four edges adjacent to the chip pads. Thus, connection between the DDR chips and the AP chip may be simplified. Accordingly, the thickness of the second substrate on which the DDR chips are mounted may be reduced, and the number of DDR chips may be reduced by half. For example, when four channels are used, two DDR chips each including the chip pads for two channels are stacked to configure the four-channel semiconductor package.

Figure 12:
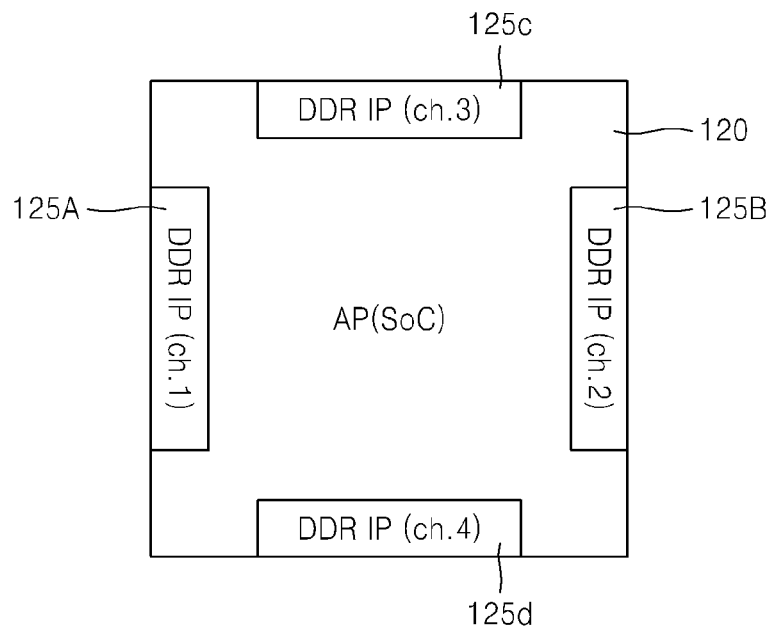
FIG. 12 is a plan view showing a location of DDR IP cores according to channel of a semiconductor chip mounted on a first package of the semiconductor package shown in FIG. 10.

FIG. 12 is a plan view showing locations of the DDR IPs according to the channels in the semiconductor chip mounted on the first package of the semiconductor package 1000f shown in FIG. 10.

Referring to FIG. 12, in the semiconductor package 1000f of the present embodiment, DDR IP cores 125A, 125B, 125C, and 125D in the first semiconductor chip 120, for example, an AP chip, may be arranged corresponding to the chip pads included in the semiconductor chip 220a and the semiconductor chip 220e. For example, the DDR IP core 125A for the first channel may be disposed on a left edge of the first semiconductor chip 120 to correspond to the chip pads 222a-1 for the first channel Ch.1, and the DDR IP core 125B for the second channel may be disposed on a right edge of the first semiconductor chip 120 to correspond to the chip pads 222a-2 for the second channel Ch.2. In addition, the DDR IP core 125C for the third channel Ch.3 may be disposed on a front edge of the first semiconductor chip 120 to correspond to the chip pads 222e-3 for the third channel Ch.3, and the DDR IP core 125D for the fourth channel Ch.4 may be disposed on a rear edge of the first semiconductor chip 120 to correspond to the chip pads 222e-4 for the fourth channel Ch.4. According to the above arrangement, wire connections between the chip pads of the DDR chips and the chip pads of the AP chip may be simplified according to the channels.

Figure 13:
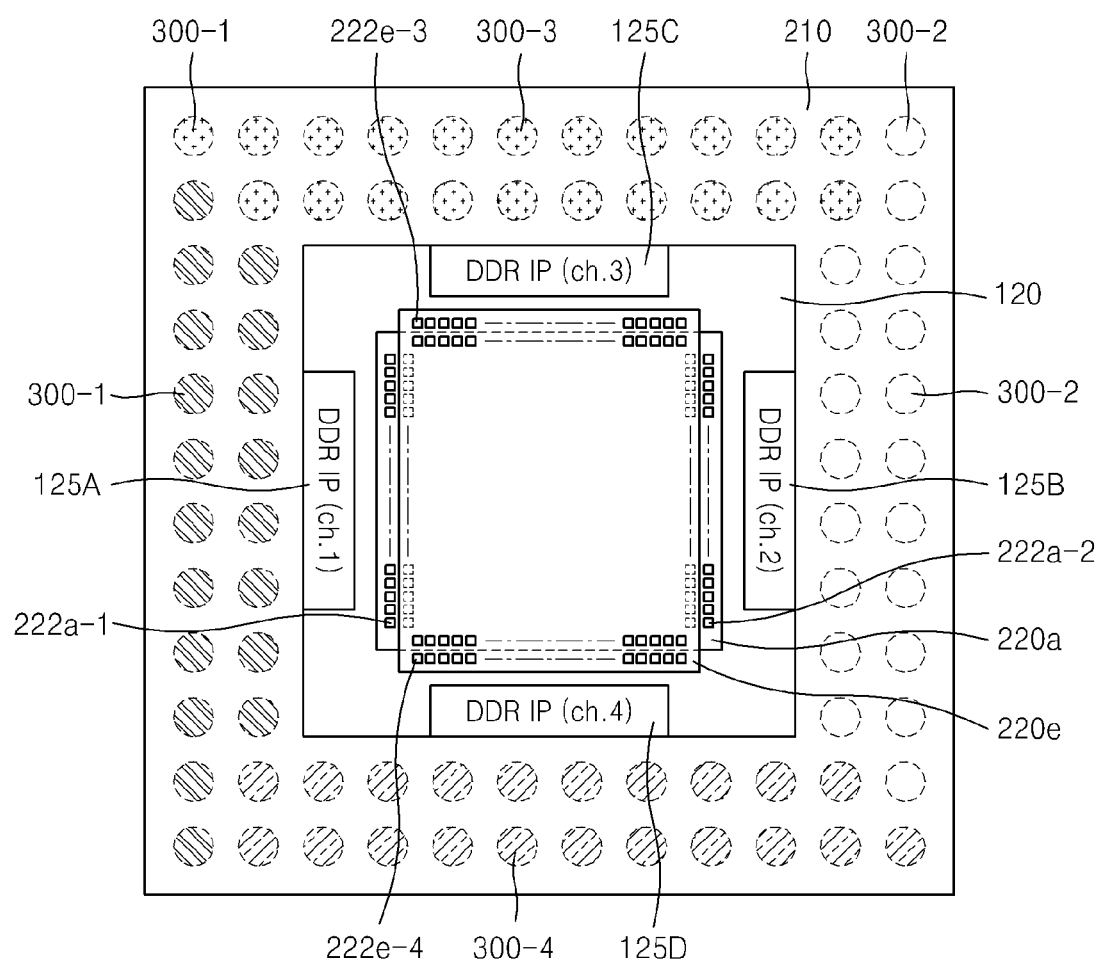
FIG. 13 is a conceptual view showing location relationships between the chip pad mounted on the second package, the DDR IP core of the semiconductor chip mounted on the first package, and a connection member disposed on a lower surface of a second substrate in the semiconductor package of FIG. 10.

FIG. 13 is a conceptual view showing a location relationships between the chip pads of the semiconductor chips mounted on the second package 200c, the DDR IP cores of the semiconductor chip mounted on the first package 100, and the connection members arranged on the lower surface of the second substrate in the semiconductor package 1000f of FIG. 10.

Referring to FIG. 13, in the semiconductor package 1000f of the present embodiment, the DDR IP core 125A for the first channel of the first semiconductor chip 120 is disposed adjacent to the chip pads 222a-1 for the first channel in the 2-1 semiconductor chip 220a, and the DDR IP core 125B for the second channel of the first semiconductor chip 120 is disposed adjacent to the chip pads 222a-2 for the second channel in the 2-1 semiconductor chip 220a. In addition, the DDR IP core 125C for the third channel of the first semiconductor chip 120 is disposed adjacent to the chip pads 222e-3 for the third channel in the 2-2 semiconductor chip 220e, and the DDR IP core 125D for the fourth channel of the first semiconductor chip 120 is disposed adjacent to the chip pads 222e-4 for the fourth channel in the 2-2 semiconductor chip 220e.

On the other hand, the connection member 300 disposed on the lower surface of the second substrate 210, on which the 2-1 semiconductor chip 220a and the 2-2 semiconductor chip 220e are mounted, is denoted by dashed line circles. The circles located on the left edge denote a connection member 300-1 between substrates, corresponding to the first channel, the circles located on the right edge denote a connection member 300-2 between substrates, corresponding to the second channel. The circles located on a front edge denote a connection member 300-3 between substrate, corresponding to the third channel, and the circles located on a rear edge denote a connection member 300-4 between substrates, corresponding to the fourth channel.

Although the first semiconductor chip 120 is bigger than the 2-1 semiconductor chip 220a and the 2-2 semiconductor chip 220e in FIG. 13, it is just an example for describing location relationships between the locations of the chip pads and the DDR IP cores. Therefore, the first semiconductor chip 120 may be equal to or smaller than the 2-1 semiconductor chip 220a and/or the 2-2 semiconductor chip 220e. In addition, as shown in FIG. 10, although the first semiconductor chip 120 is mounted on the first substrate 110 and is disposed under the second substrate 210, the first semiconductor chip 120 is shown with the 2-1 semiconductor chip 220a and the 2-2 semiconductor chip 220e on the second substrate 210 for the convenience of description.

While the inventive concept has been particularly shown and described with reference to example embodiments thereof, it will be understood that various changes in form and details may be made therein without departing from the spirit and scope of the following claims.

What is claimed is:

1. A semiconductor package of a package on package (POP) structure, the semiconductor package comprising:
   a first package including a first substrate and a first semiconductor chip portion mounted on the first substrate;
   a second package disposed on the first package, the second package including a second substrate and a second semiconductor chip portion mounted on the second substrate; and
   a connection member between substrates for connecting the first substrate and the second substrate to each other,
   wherein the second semiconductor chip portion includes at least one semiconductor chip, and the at least one semiconductor chip includes a group of chip pads corresponding to one channel, the group of chip pads being concentrated on a first edge of the semiconductor chip,
   an intellectual property (IP) core corresponding to the one channel is on an edge of the first semiconductor chip portion, the IP core corresponding to the first edge on which the group of chip pads is concentrated, and
   the one channel is a communication channel for communicating a number of bits of data between the group of chip pads and the IP core.

2. The semiconductor package of claim 1, wherein in the at least one semiconductor chip, a group of chip pads corresponding to another channel is on a second edge of the semiconductor chip, the second edge being opposite to the first edge.

3. The semiconductor package of claim 1, wherein the one channel is for 32 bits, and the group of chip pads comprises pads for address terminals, pads for control terminals, and pads for data terminals.

4. The semiconductor package of claim 1, wherein the second semiconductor chip portion comprises a first semiconductor chip, the first semiconductor chip including:
   a first chip pad group corresponding to a first channel on a first edge of the first semiconductor chip, and
   a second chip pad group corresponding to a second channel on a second edge of the first semiconductor chip.

5. The semiconductor package of claim 1, wherein the second semiconductor chip portion comprises a first semiconductor chip and a second semiconductor chip,
   the first semiconductor chip including,
      a first chip pad group corresponding to a first channel on a first edge of the first semiconductor chip, and
      a second chip pad group corresponding to a second channel on a second edge of the first semiconductor chip; and
   the second semiconductor chip including
      a third chip pad group corresponding to a third channel on a third edge of the second semiconductor chip, and
      a fourth chip pad group corresponding to a fourth channel on a fourth edge of the second semiconductor chip,
      wherein the second semiconductor chip is disposed on the first semiconductor chip such that the third and fourth chip pad groups are arranged to cross the first or second chip pad groups at an angle of 90°.

6. The semiconductor package of claim 5, wherein first through fourth bonding pads groups are disposed on four edges on the second substrate to correspond to locations of the first through fourth chip pad groups, and the first through fourth chip pad groups are respectively connected to corresponding first through fourth bonding pads groups through wire-bonding.

7. The semiconductor package of claim 1, wherein the second semiconductor chip portion comprises a first semiconductor chip and a second semiconductor chip, where a first chip pad group corresponding to a first channel is disposed on a first edge of the first and second semiconductor chips and a second chip pad group corresponding to a second channel is disposed on a second edge of the first and second semiconductor chips.

8. The semiconductor package of claim 7, wherein the first semiconductor chip comprises through silicon vias (TSVs) and is stacked on the second substrate in a flip-chip bonding, and the second semiconductor chip is stacked on the first semiconductor chip in a flip-chip bonding, where the first and second chip pad groups of the second semiconductor chip are configured to electrically connect the first and second chip pad groups of the first semiconductor chip through the TSVs.

9. The semiconductor package of claim 1, wherein the first semiconductor chip portion comprises at least one logic chip, and the second semiconductor chip portion comprises at least one memory chip.

10. The semiconductor package of claim 1, wherein the second semiconductor chip portion is mounted on and electrically connected to the second substrate through a wire-bonding, the second semiconductor package further comprises a sealing material for sealing the second semiconductor chip portion and wires, the first semiconductor chip portion is mounted on the first substrate in a flip-chip bonding, the first semiconductor package comprises an underfill or an adhesive member formed between the first semiconductor chip portion and the first substrate.

11. A semiconductor package comprising:
a substrate;
one or more semiconductor chips stacked on the substrate; and
a sealing material for sealing the one or more semiconductor chips,
wherein in each of the semiconductor chips, a first chip pad group corresponds to a first channel is on a first edge of the semiconductor chip, and a second chip pad group corresponding to a second channel is on a second edge of the semiconductor chip, and
each of the first and second channels is a communication channel for communicating a number of bits of data to and from the corresponding one of the first and second chip pad groups.

12. The semiconductor package of claim 11, wherein each of the first and second channels is for 32-bits, and each of the first and second chip pad groups comprises pads for address terminals, pads for control terminals, and pads for data terminals.

13. The semiconductor package of claim 11, wherein the one or more semiconductor chips comprise a first semiconductor chip and a second semiconductor chip,
the first semiconductor chip including,
 a first chip pad group corresponding to a first channel on a first edge of the first semiconductor chip, and
 a second chip pad group corresponding to a second channel on a second edge of the first semiconductor chip; and
the second semiconductor chip including,
 a third chip pad group corresponding to a third channel on a third edge of the second semiconductor chip, and
 a fourth chip pad group corresponding to a fourth channel on a fourth edge of the second semiconductor chip, wherein the second semiconductor chip is disposed on the first semiconductor chip such that the third and fourth chip pad groups are arranged to cross the first or second chip pad group at an angle of 90°.

14. The semiconductor package of claim 13, wherein the first semiconductor chip comprises through silicon vias (TSVs) and is stacked on the substrate in a flip-chip bonding, and the second semiconductor chip is stacked on the first semiconductor chip in a flip-chip bonding, where the first and second chip pad groups of the second semiconductor chip are configured to electrically connect the first and second chip pad groups of the first semiconductor chip through the TSVs.

15. The semiconductor package of claim 11, further comprising:
a lower substrate disposed under the substrate and on which one or more semiconductor chips are mounted; and
a connection member between substrates, the connection member configured to support the substrate and configured to connect the substrate to the lower substrate,
wherein the one or more semiconductor chips on the substrate are logic chips, and the one or more semiconductor chips on the lower substrate are memory chips.

16. A semiconductor package of a package on package (POP) structure, the semiconductor package comprising:
a first package including at least one first semiconductor chip on a first substrate, the at least one first semiconductor having a plurality of IP cores, each IP core on each edge of the first semiconductor chip, each IP core configured to correspond to a respective channel;
a second package on the first package, the second package including at least one second semiconductor chip on a second substrate, the at least one second semiconductor having groups of chip pads, each group of chip pads concentrated on a respective edge of the second semiconductor chip, each group of chip pads being in close proximity to a corresponding one of the IP cores; and
a plurality of connection members between the first package and the second package, the connection members disposed outwardly around the second semiconductor chip, the connection members configured to electrically connect the second substrate to the first substrate,
wherein the channel is a communication channel for communicating a number of bits of data between corresponding one of the group of chip pads and the IP core.

17. The semiconductor package of claim 16, further comprising:
a plurality of wirings, the wirings configured to electrically connect a plurality of chip pads on the at least one second semiconductor chip to a plurality of bonding pads on the second substrate.

18. The semiconductor package of claim 17, wherein the plurality of wirings is a plurality of through silicon vias (TSVs) in the at least one second semiconductor chip.

19. The semiconductor package of claim 16, wherein a peripheral area of the second substrate exposed by the at least one second semiconductor chip is apportioned into a plurality of sub-areas according to a number of channels and each of a plurality of sub-areas in close proximity to the one of the channels is configured to accommodate connection members corresponding to the respective channel.

* * * * *